United States Patent [19]

Shastry

[11] Patent Number: 4,699,688
[45] Date of Patent: Oct. 13, 1987

[54] METHOD OF EPITAXIALLY GROWING GALLIUM ARSENIDE ON SILICON

[75] Inventor: Shambhu K. Shastry, Framingham, Mass.

[73] Assignee: GTE Laboratories Incorporated, Waltham, Mass.

[21] Appl. No.: 885,343

[22] Filed: Jul. 14, 1986

[51] Int. Cl.[4] ............ C30B 25/02; C30B 25/10; C30B 25/18; H01L 21/205

[52] U.S. Cl. .................. 156/606; 156/610; 156/612; 156/613; 156/DIG. 70; 156/DIG. 89; 156/DIG. 113

[58] Field of Search ........... 156/606, 610, 612, 613, 156/614, DIG. 70, DIG. 89, DIG. 113; 427/51, 86; 148/DIG. 72, 175

[56] References Cited

U.S. PATENT DOCUMENTS

| 3,725,284 | 4/1973 | Touchy | 156/606 |
| 4,062,706 | 12/1977 | Ruehrwein | 156/610 |
| 4,147,571 | 4/1979 | Stringfellow et al. | 156/610 |
| 4,368,098 | 1/1983 | Manasevit | 156/614 |
| 4,407,694 | 10/1983 | Eu et al. | 156/606 |
| 4,504,331 | 3/1985 | Kuech et al. | 156/606 |
| 4,561,916 | 12/1985 | Akiyama et al. | 156/612 |
| 4,588,451 | 5/1986 | Vernon | 156/612 |

OTHER PUBLICATIONS

Tsaur et al., "Molecular Beam Epitaxy of GaAs and AlGaAs on Si", Appl. Phys. Lett. 45(5), 1.Sep. 1984, pp. 535–536.
Akiyama et al., "Growth of GaAs on Si by MOVCD", J. Crys. Growth 68 (1984) pp. 21–26.
Akiyama et al, "Growth of High Quality GaAs Layers on Si Substrates by MOCVD", J. Crys. Growth 77 (1986), pp. 490–497, Sep.
Mizuguchi et al., "MOCVD GaAs Growth on Ge (100) and Si (100) Substrates", J. Crys. Growth 77 (1986), pp. 509–514, Sep.
Norris et al., "Reduced Pressure MOVPE Growth . . . ", J. Crys. Growth, vol. 68, No. 1, 1 Sep. 1984.
Christou et al., "Low Temperature Epitaxial Growth of GaAs On (100) Silicon Substrates", Electronics Letters, vol. 21, No. 9, 25 Apr. 1985.
Shastry et al., "Devices on GaAs Directly Grown on (100)-Si . . . ", 3rd Int. Workshop on the Physics of Semiconductor Devices, Madras, India, 1985.
Zemon et al., "Photoluminescence . . . ", Solid State Communications, vol. 58, No. 7, pp. 457–460, May 1986.

Primary Examiner—John Doll
Assistant Examiner—R. Bruce Breneman
Attorney, Agent, or Firm—David M. Keay

[57] ABSTRACT

Two-step process of expitaxially growing gallium arsenide on a silicon substrate. A silicon substrate is heated to about 450° C. in a reaction chamber and arsine and triethylgallium are introduced into the chamber. After a thin seed layer of gallium arsenide is grown at a relatively slow rate, the silicon substrate is heated to about 600° C. and a thick buffer layer of gallium arsenide is grown at a relatively fast rate.

12 Claims, 1 Drawing Figure

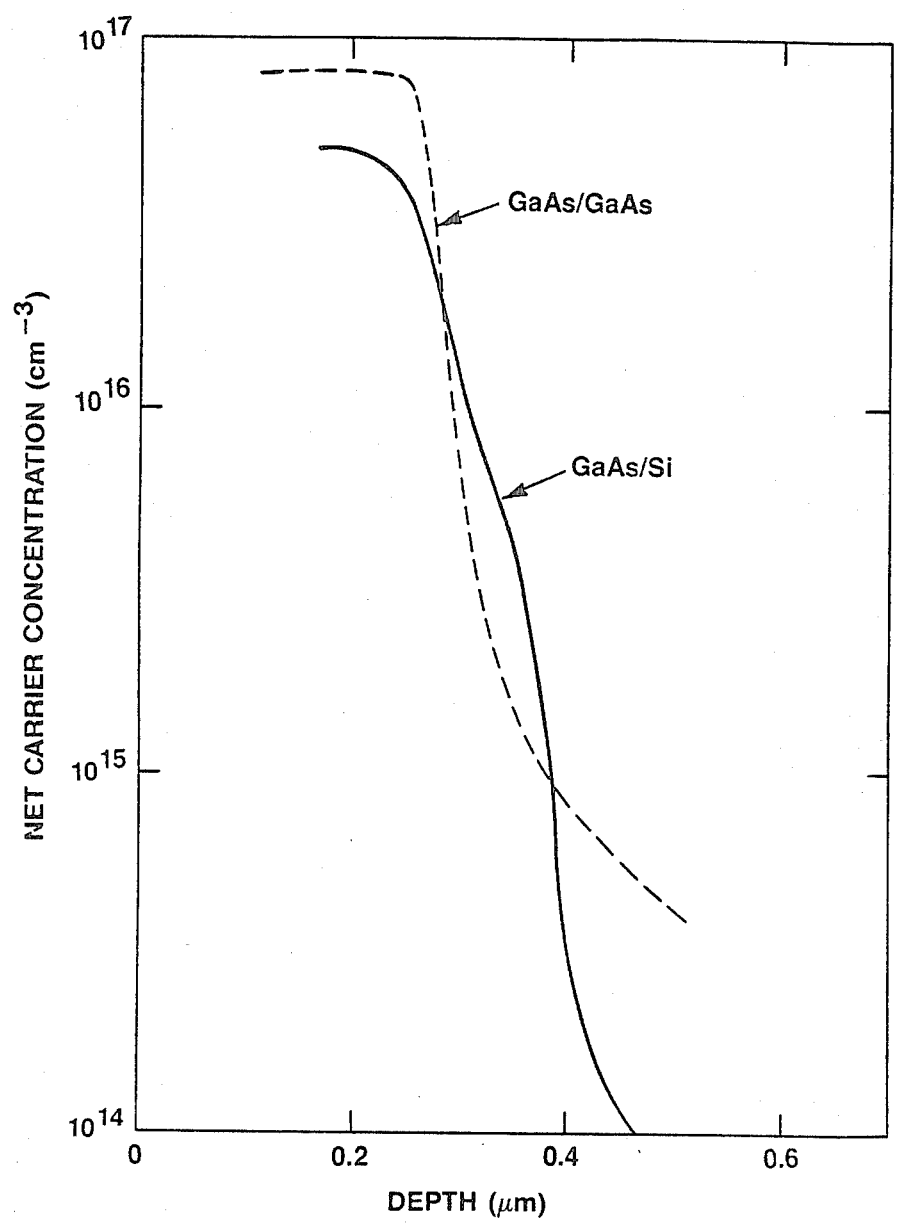

METHOD OF EPITAXIALLY GROWING GALLIUM ARSENIDE ON SILICON

BACKGROUND OF THE INVENTION

This invention relates to semiconductor materials. More particularly, it is concerned with methods of expitaxially growing one semiconductor material on a substrate of a different semiconductor material.

The heteroepitaxial growth of gallium arsenide directly on silicon substrates is desirable for the monolithic integration of gallium arsenide and silicon device technologies, and for the fabrication of high efficiency light-emitting diodes and solar cells on relatively low cost and high purity silicon substrates. Gallium arsenide has been grown expitaxially on silicon substrates by employing molecular beam epitaxy (MBE) and metalorganic vapor phase epitaxy (MOVPE) techniques. These processes, however, require heating of the silicon substrates to high temperatures, of the order of 850° C. or more, prior to the deposition procedure in order to produce device quality gallium arsenide epitaxial layers. These temperatures may be detrimental to device structures previously fabricated within the silicon substrates. In addition, the large thermal expansion and lattice mismatches between gallium arsenide and silicon are likely to cause stress and dislocations in the epitaxial layer and thus impose restrictions on the thickness of the layer.

SUMMARY OF THE INVENTION

The improved method of epitaxially growing gallium arsenide on silicon substrates in accordance with the present invention comprises placing a substrate of single crystal silicon having exposed surface areas in a chamber. A first vapor containing arsenic and a second vapor containing gallium are introduced into the chamber while the body is heated at a first predetermined temperature to grow a first relatively thin layer of single crystal gallium arsenide on the exposed surface areas of the substrate during a first deposition step. The temperature of the substrate is increased to a second predetermined temperature. The first vapor and the second vapor are introduced into the chamber while heating the substrate at the second predetermined temperature to grow a second relatively thick layer of single crystal gallium arsenide on the first layer during a second deposition step.

BRIEF DESCRIPTION OF THE DRAWING

The single figure of the drawing illustrates the doping profiles of epitaxially grown gallium arsenide on silicon compared with epitaxially grown gallium arsenide on gallium arsenide in which a portion of each of the epitaxially grown gallium arsenide layers is doped with silicon.

For a better understanding of the present invention, together with other and further objects, advantages, and capabilities thereof, reference is made to the following disclosure and appended claims in connection with the above-described drawing.

DETAILED DESCRIPTION

The method of growing single crystal gallium arsenide on silicon in accordance with the present invention is a two-step MOVPE process. A seed layer which is preferably about 8 nanometers thick is grown at a temperature of between 425° C. and 450° C., preferably at about 450° C. Subsequent growth of a buffer layer of from 0.3 to 3 micrometers thick is carried out at a temperature of between 575° C. and 650° C., preferably at about 600° C. The epitaxially grown layers are specular, (100)-oriented when grown on (100)-oriented silicon substrates, and appear to be largely of single domain. Silicon doped layers, when desired, are grown at a temperature of about 650° C.

More particularly, wafers of (100)-oriented silicon were chemically cleaned by dipping in a 20 percent HF solution for a period of 10 to 15 seconds and then blown dry. Each wafer was placed in an introductory chamber of an MOVPE reactor which was pumped down and flushed four times with argon. The wafer was then transferred into the reaction chamber and placed on a graphite susceptor. The graphite susceptor was heated by RF energy applied to induction heating coils encircling the quartz reactor tube.

After the silicon wafer was placed in the reactor chamber, the pressure was reduced to between 40 torr to 100 torr, preferably about 50 torr, and the temperature of the wafer was raised to about 450° C. When the temperature reached about 300° C., arsine (10 percent $AsH_3$ in hydrogen) was admitted to the chamber at a rate of 56 standard cubic centimeters per minutes (sccm). When the temperature was stabilized at about 450° C., triethylgallium (2 percent TEG in hydrogen) was introduced into the reactor chamber at a flow rate of 8 sccm. The ratio of arsenic atoms to gallium atoms admitted to the reactor chamber was about 300 to 1, and desirably is not lower than about 200 to 1. The conditions within the reactor chamber were such that the growth rate of gallium arsenide on the silicon was at about 3 nanometers per minute. These conditions were maintained for from 2 to 3 minutes to produce a seed layer of from 5 to 10 nanometers thick. The substrate temperature was raised to about 600° C. The flow rate of the arsine vapor was held the same and the flow rate of the triethylgallium-hydrogen mixture was raised to 125 sccm. Under these conditions a gallium arsenide buffer layer was grown at a rate of about 40 nanometers per minute. These conditions were maintained for about 7 to 90 minutes to grow a buffer layer between 0.3 and 3 micrometers thick.

In order to dope the gallium arsenide with silicon, silane gas (0.2 percent $SiH_4$ in hydrogen) was admitted into the reactor chamber at a gas flow rate of 5 standard liters per minute (slm), together with the arsine and triethylgallium, while heating the substrate at a temperature of about 650° C.

The single figure of the drawing illustrates the doping profile of gallium arsenide grown on silicon in accordance with the method described hereinabove. The gallium arsenide epitaxial layer was of the order of 1 micrometer thick and the upper 0.25 micrometer was doped with silicon. The figure also illustrates the doping profile of an epitaxial layer of gallium arsenide grown on a gallium arsenide substrate under similar conditions at temperatures of 600° C. and 650° C. The abruptness of the n-n⁻ interface in the gallium arsenide grown on silicon is somewhat inferior to that obtained in the homoepitaxial gallium arsenide layer. The undoped gallium arsenide on silicon layer has a net carrier concentration of less than $10^{14} cm^{-3}$, and thus the possibility of significant doping taking place from the silicon substrate can be ruled out. Hall effect measurements made on layers doped to about $10^{16} cm^{-3}$ indicate room temperature electron mobility of 5700 cm$^2$/V-s, signifying a single domain structure.

Au/GaAs Schottky diodes were fabricated on 0.6 micrometer thick layers of undoped gallium arsenide deposited on N-type silicon substrates. The devices had low reverse leakage currents (0.05 A/cm$^2$ at 8V) and breakdown voltages of 8–10V. Schottky solar cells formed in layers 0.6 micrometers thick had short-circuit current densities comparable to those of homoepitaxial GaAs Schottky solar cells (17–18 mA/cm$^2$) FET device structures were formed on 1.2 micrometers thick gallium arsenide grown on P-type silicon. The upper 0.2 micrometer of the gallium arsenide was doped to be N-type with a concentration of about $6 \times 10^{16}$ cm$^{-3}$ to provide the active layer. These devices exhibited good electrical characteristics with satisfactory electrical isolation from the silicon substrate.

The method of epitaxially growing gallium arsenide on silicon substrates as described hereinabove is a relatively simple, low temperature process. The two-step process produces gallium arsenide layers which are largely of single domain device quality. Satisfactory electrical isolation is obtained between the gallium arsenide layer and the underlying silicon substrate. Also by virtue of the lower temperatures employed and the relative simplicity of the process, production output may be greatly increased.

While there has been shown and described what are considered preferred embodiments of the present invention, it will be obvious to those skilled in the art that various changes and modifications may be made therein without departing from the invention as defined by the appended claims.

What is claimed is:

1. The method of epitaxially growing gallium arsenide on a substrate of silicon comprising
   placing a substrate of single crystal silicon having exposed surface areas in a chamber;
   introducing a first vapor containing arsenic and a second vapor containing gallium into the chamber while heating said substrate at a first temperature to grow a first relatively thin layer of single crystal gallium arsenide on the exposed surface areas of the substrate during a first deposition step;
   increasing the temperature of the substrate to a second temperature;
   introducing said first vapor and said second vapor into the chamber while heating said substrate at said second temperature to grow a second relatively thick layer of single crystal gallium arsenide directly on said first layer of single crystal gallium arsenide during a second deposition step; and wherein
   said first vapor includes arsine;
   said second vapor includes triethylgallium;
   said first temperature is between 425° C. and 450° C.;
   said second temperature is between 575° C. and 650° C.;
   the pressure within the chamber during said first and second deposition steps is between 40 torr and 100 torr;
   during said first deposition step said first vapor and said second vapor are introduced at a rate causing said first layer to grow in thickness at a growth rate of about 3 nanometers per minute;
   during said second deposition step said first and second vapors are introduced at a rate causing said second layer to grow in thickness at a growth rate of about 40 nanometers per minute; and
   prior to said first deposition step introducing said first vapor into the chamber.

2. The method in accordance with claim 1 wherein said first temperature is about 450° C.; and said second temperature is about 600° C.

3. The method in accordance with claim 2 wherein said first deposition step is carried on for a period of from 2 to 3 minutes and a first layer of from 5 to 10 nanometers is grown; and
   said second deposition step is carried on for a period of from about 7 to about 90 minutes and a second layer of from 0.3 to 3 micrometers is grown.

4. The method in accordance with claim 3 including introducing silane together with arsine and triethylgallium whereby the single crystal gallium arsenide is doped with silicon 5. The method of epitaxially growing gallium arsenide on a substrate of silicon comprising
   placing a substrate of single crystal silicon having exposed surface areas in a chamber;
   introducing a first vapor containing arsenic and a second vapor containing gallium into the chamber while heating said substrate at a first temperature to grow a first relatively thin layer of single crystal gallium arsenide on the exposed surface areas of the substrate during a first deposition step;
   increasing the temperature of the substrate to a second temperature;
   introducing said first vapor and said second vapor into the chamber while heating said substrate at said second temperature to grow a second relatively thick layer of single crystal gallium arsenide directly on said first layer of single crystal gallium arsenide during a second deposition step, and wherein
   said first vapor includes arsine;
   said second vapor includes triethylgallium; and
   during said first deposition step the ratio of arsenic atoms to gallium atoms introduced into the chamber is at least 200 to 1.

6. The method in accordance with claim 5 including prior to said first deposition step
   introducing said first vapor into the chamber.

7. The method in accordance with claim 6 wherein said first temperature is between 425° C. and 450° C.; and
   said second temperature is between 575° C. and 650° C.

8. The method in accordance with claim 7 wherein the pressure within the chamber during said first and second deposition steps is between 40 torr and 100 torr.

9. The method in accordance with claim 8 wherein during said first deposition step said first vapor and said second vapor are introduced at a rate causing said first layer to grow in thickness at a growth rate of about 3 nanometers per minute; and
   during said second deposition step said first and second vapors are introduced at a rate causing said second layer to grow in thickness at a growth rate of about 40 nanometers per minute.

10. The method in accordance with claim 9 wherein said first deposition step is carried on for a period of from 2 to 3 minutes and a first layer of from 5 to 10 nanometers is grown; and said second deposition step is carried on for a period of from about 7 to about 90 minutes and a second layer of from 0.3 to 3 micrometers is grown.

11. The method in accordance with claim 10 wherein said first temperature is about 450° C.; and said second temperature is about 600° C.

12. The method in accordance with claim 11 including introducing silane together with arsine and triethylgallium whereby the single crystal gallium arsenide is doped with silicon.

* * * * *